(12) United States Patent
Kumagai et al.

(10) Patent No.: US 9,496,456 B2
(45) Date of Patent: Nov. 15, 2016

(54) SEMICONDUCTOR LIGHT EMITTING ELEMENT

(71) Applicant: STANLEY ELECTRIC CO., LTD., Meguro-ku, Tokyo (JP)

(72) Inventors: Mitsuyasu Kumagai, Yokohama (JP); Ji-Hao Liang, Yokohama (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 14/839,398

(22) Filed: Aug. 28, 2015

(65) Prior Publication Data

US 2016/0087145 A1 Mar. 24, 2016

(30) Foreign Application Priority Data

Sep. 19, 2014 (JP) ................................. 2014-191268

(51) Int. Cl.

| | |
|---|---|
| H01L 33/32 | (2010.01) |
| H01L 33/24 | (2010.01) |
| H01L 33/06 | (2010.01) |
| H01L 33/20 | (2010.01) |
| H01L 21/02 | (2006.01) |
| H01L 33/00 | (2010.01) |
| H01L 33/02 | (2010.01) |

(52) U.S. Cl.
CPC .......... *H01L 33/06* (2013.01); *H01L 21/0254* (2013.01); *H01L 21/0259* (2013.01); *H01L 21/02458* (2013.01); *H01L 21/02505* (2013.01); *H01L 21/02513* (2013.01); *H01L 33/20* (2013.01); *H01L 33/24* (2013.01); *H01L 33/32* (2013.01); *H01L 33/007* (2013.01); *H01L 33/025* (2013.01)

(58) Field of Classification Search
None
See application file for complete search history.

(56) References Cited

U.S. PATENT DOCUMENTS

| | | | |
|---|---|---|---|
| 7,446,345 | B2 | 11/2008 | Emerson et al. |
| 7,611,917 | B2 | 11/2009 | Emerson et al. |
| 2006/0246612 | A1 | 11/2006 | Emerson et al. |

(Continued)

FOREIGN PATENT DOCUMENTS

| | | | | |
|---|---|---|---|---|
| JP | 2008218746 | * | 9/2008 | ............ H01L 33/00 |
| JP | 5415756 B2 | | 2/2014 | |

OTHER PUBLICATIONS

Extended European Search Report dated Feb. 24, 2016, issued in counterpart European Application No. 15185894.1.

(Continued)

*Primary Examiner* — Pamela E Perkins
(74) *Attorney, Agent, or Firm* — Holtz, Holtz & Volek PC

(57) ABSTRACT

A semiconductor light emitting element includes: a pit formation layer formed on the first semiconductor layer and having a pyramidal pit; and an active layer formed on the pit formation layer and having a flat portion and an embedded portion which is formed so as to embed the pit. The active layer has a multi-quantum well structure having a well layer and a barrier layer laminated alternately in which each well layer and each barrier layer lie one upon another. The flat portion has a flat well portion corresponding to the well layer. The embedded portion has an embedded well portion corresponding to the well layer. The embedded well portion has a ring portion which is formed in an interface with the flat well portion so as to surround the threading dislocation. The ring portion has a band gap smaller than that of the flat well portion.

6 Claims, 4 Drawing Sheets

(56) References Cited

U.S. PATENT DOCUMENTS

| | | | |
|---|---|---|---|
| 2010/0207097 A1* | 8/2010 | Oh | H01L 33/18 257/13 |
| 2013/0082273 A1* | 4/2013 | Ting | H01L 21/02458 257/76 |
| 2014/0057417 A1 | 2/2014 | Leirer et al. | |
| 2014/0225059 A1* | 8/2014 | Yang | H01L 33/145 257/13 |

OTHER PUBLICATIONS

Hangleiter, et al., "Suppression of Nonradiative Recombination by V-Shaped Pits in GaInN/GaN Quantum Wells Produces a Large Increase in the Light Emission Efficiency", Physical Review Letters, American Physical Society; vol. 95, No. 12, Sep. 16, 2005, pp. 127402/1-127402/4.

Nakamura, et al., "High-Quality InGaN Films Grown on GaN Films", Jan. 1, 2000, The Blue Laser Diode, Berlin: Springer, 2000, DE, pp. 150-155.

Netzel, et al., "Emission and recombination characteristics of Ga1-xInxN/GaN quantum well structures with nonradiative recombination suppression by V-shaped pits", Physical Review B (Condensed Matter and Materials Physics); vol. 76, No. 15, Oct. 15, 2007, pp. 155322/1-155322/13.

Sheen, et al., "V-pits as Barriers to Diffusion of Carriers in InGaN/GaN Quantum Wells", Journal of Electronic Materials; vol. 44, No. 11, Nov. 1, 2015, pp. 4134-4138.

* cited by examiner

SEMICONDUCTOR LIGHT EMITTING ELEMENT

BACKGROUND OF THE INVENTION

1. Field of the Invention

The present invention relates to a semiconductor light emitting element such as a light emitting diode (LED).

2. Description of the Related Art

The semiconductor light emitting element is generally fabricated typically by forming, on a growth substrate, an n-type semiconductor layer, a light emitting layer, and a p-type semiconductor layer, and then by forming an n-electrode and a p-electrode which apply a voltage to the n-type semiconductor layer and the p-type semiconductor layer. When the semiconductor light emitting element is fabricated to use a nitride-based semiconductor material, a sapphire substrate is used as a growth substrate, for example.

Japanese Patent No. 5415756 discloses a light emitting device comprising a pit opening layer including pits; an active region including plural quantum well layers; a hole injection layer; and a contact layer, wherein the light emitting device is configured such that the quantum well layers and the hole injection layers enter the pits without closing the pits, and the contact layer closes the pits.

SUMMARY OF THE INVENTION

When a semiconductor light emitting element is fabricated such that a nitride semiconductor layer is grown on a substrate made of a material different from the nitride semiconductor such as a sapphire substrate, crystal defects (misfit dislocations) occur at an interface between the substrate and the semiconductor layer due to their lattice mismatch. These crystal defects are formed so as to penetrate the semiconductor layer in the layered direction of the semiconductor layer during crystal growth. Each dislocation defect extending in the layered direction of the semiconductor layer is called a threading dislocation.

When the threading dislocation reaches the active layer in the semiconductor layer, the threading dislocation functions as non-radiation recombination center and becomes a factor of lowering the luminous efficiency. There is a method for avoiding the reaching of the threading dislocation to the active layer by making a pyramidal recess portion having an apex positioned at the end of the threading dislocation. This recess portion is called a pit having inclined side surfaces surrounding the threading dislocation.

When an active layer is grown on the pit after pit formation, the active layer is layered on the inclined side surface of the pit at a growth rate slower than that on the other portion (flat portion). Therefore, the thickness of the active layer adjacent to the pit i.e., the threading dislocation becomes thinner, and its quantum energy level increases in comparison with the other portion of the active layer. Therefore, carriers are prevented from reaching the threading dislocation, so that lowering of the luminous efficiency can be prevented (i.e., pit function).

However when the light emitting element is driven by a large current or driven at a high temperature, an active layer with a small thickness formed in the pit may promote to access carriers the threading dislocation. Specifically, electrons become hot electrons at a high temperature situation, for example, so that some hot electrons may readily pass through the active layer in the pit and reach the threading dislocation. Therefore, when the light emitting element is driven by a large current or driven at a high temperature, superiority of the pit function is reduced. Thus often it is not possible to suppress a decrease in luminous efficiency.

The present invention has been made in view of the aforementioned respects. It is an object of the present invention to provide a semiconductor light emitting element which can significantly reduce the access of carriers to the threading dislocation in the pit to have a high light emission efficiency even when driven by a large current or driven at a high temperature.

A semiconductor light emitting element of the present invention is a semiconductor light emitting element including:

a first semiconductor layer of a first conductivity type;

a pit formation layer formed on the first semiconductor layer and having a pyramidal pit caused by a threading dislocation generated in the first semiconductor layer;

an active layer formed on the pit formation layer and having a flat portion and an embedded portion which is formed so as to embed the pit; and a second semiconductor formed on the active layer and having a second conductivity type which is opposite to the first conductivity type, wherein the active layer has a multi-quantum well structure having at least one well layer and at least one barrier layer laminated alternately in which each well layer and each barrier layer lie one upon another, the flat portion has at least one flat well portion corresponding to the at least one well layer, the embedded portion has at least one embedded well portion corresponding to the at least one well layer, each of the at least one embedded well portion has at least one ring portion which is formed in an interface with each of the at least one flat well portion so as to surround the threading dislocation, each of the at least one ring portion has a band gap smaller than that of each of the at least one flat well portion.

BRIEF DESCRIPTION OF THE DRAWINGS

The aforementioned aspects and other features of the present invention are explained in the following description, taken in connection with the accompanying drawing figures wherein.

DETAILED DESCRIPTION OF THE INVENTION

Hereinafter, various embodiments of the present invention will be described in detail with reference to the drawings.

First Embodiment

Figure 1A:
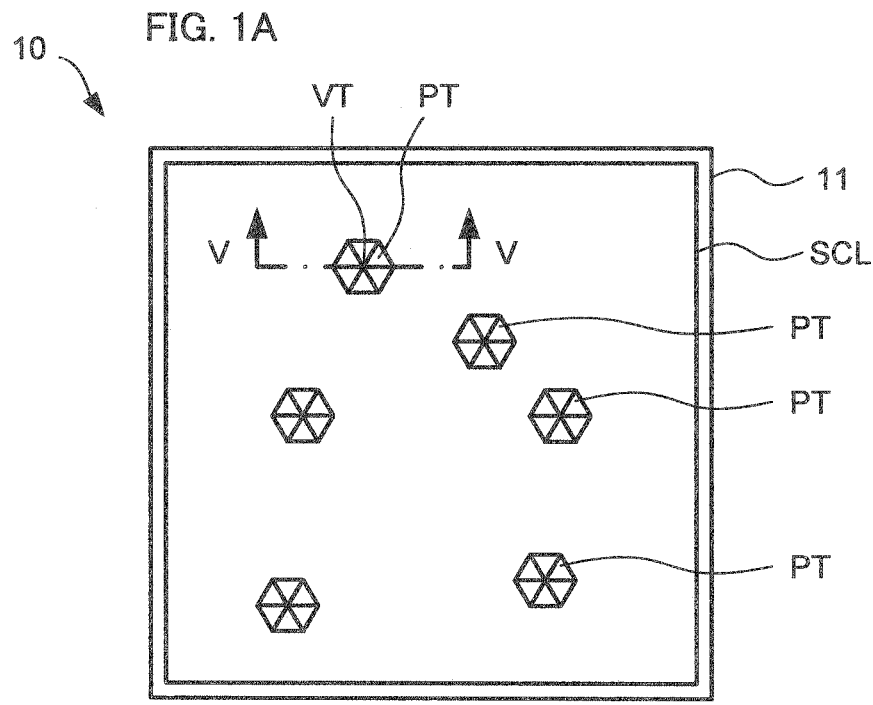
FIG. 1A shows a top view of the semiconductor light emitting element of a first embodiment.
Figure 1B:
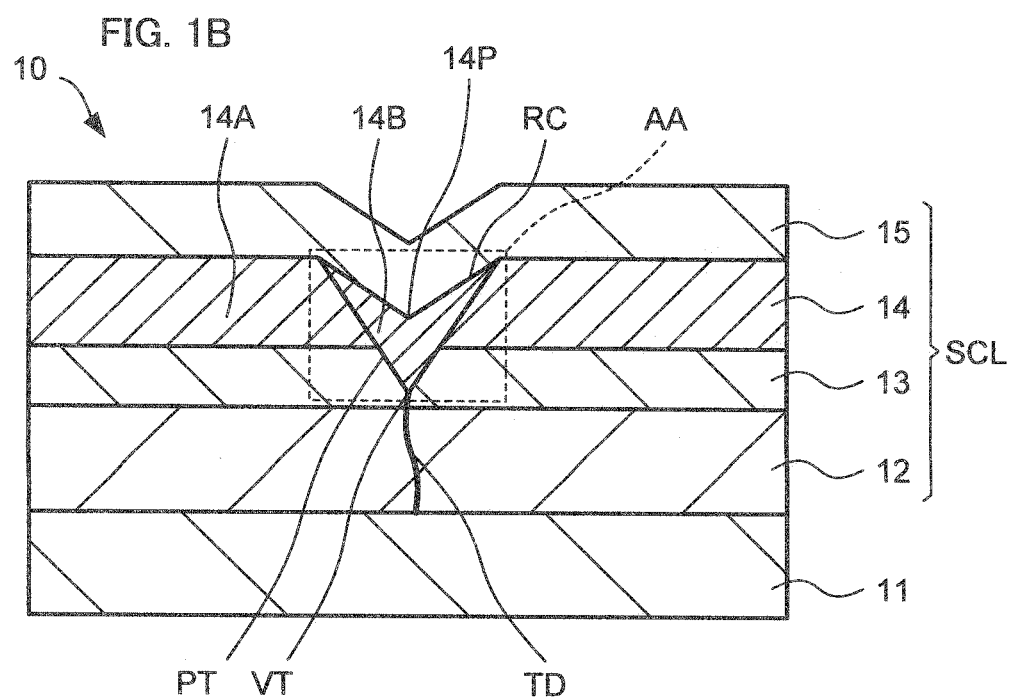
FIG. 1B is a cross-sectional view schematically partially illustrating a configuration, adjacent to a pit, of a semiconductor light emitting element of the first embodiment.

FIG. 1A shows a top view of a semiconductor light emitting element 10 (hereinafter simply referred to as the light emitting element or element) according to the first embodiment. FIG. 1B shows a cross-sectional view schematically partially illustrating a configuration of the semiconductor light emitting element 10. FIG. 1B shows a cross-section cut along a line V-V shown in FIG. 1A. The light emitting element 10 has a semiconductor structure layer SCL formed on a substrate 11. The semiconductor structure layer SCL has a threading dislocation TD which is caused by the lattice mismatch between the substrate 11 and the semiconductor structure layer SCL. The semiconductor structure layer SCL has a pyramidal pit PT due to the threading dislocation TD.

In the present embodiment, the semiconductor structure layer SCL is made from nitride-based semiconductors. Hereinafter a situation that the pit PT has a hexagonal pyramid-shaped form is described. Further, the present embodiment of the semiconductor structure layer SCL is made from GaN-based semiconductors is described. Further, the substrate 11 is made of sapphire, for example. The semiconductor structure layer SCL is grown on a C-plane of sapphire.

The light emitting element 10 has an n-type semiconductor layer 12 (first semiconductor layer) formed on the substrate 11. The n-type semiconductor layer 12 is a Si doped GaN layer, for example. The n-type semiconductor layer 12 has the threading dislocation TD which is formed to penetrate the n-type semiconductor layer 12 caused by the misfit dislocation generated on the interface with the substrate 11.

The light emitting element 10 is formed on the n-type semiconductor layer 12. The light emitting element 10 has a pit formation layer 13 including the pyramidal pit PT caused by the threading dislocation TD generated in the n-type semiconductor layer 12. Specifically, the pit formation layer 13 has the threading dislocation TD penetrating the n-type semiconductor layer 12 into the pit formation layer 13. In other words, the threading dislocation TD is formed to have such a depth that the threading dislocation originates at the interface between the substrate 11 and the n-type semiconductor layer 12 and penetrates the n-type semiconductor layer 12 into the pit formation layer 13. Further, the pit formation layer 13 has a hexagonal pyramid-shaped pit PT having the apex VT being a dislocation point of the threading dislocation TD in the pit formation layer 13.

The pit PT may be formed inside the pit formation layer 13, for example, by forming a super-lattice structure layer as the pit formation layer 13. In the present embodiment, the pit formation layer 13 may have super-lattice structure (SLS) configured with at least one well layer (not shown) and at least one barrier layer (not shown). This case will be described as follows.

The light emitting element 10 has an active layer 14 formed on the pit formation layer 13. The active layer 14 has a pit formation layer 13 and an embedded portion 14B which is formed to embed the pit PT. The flat portion 14A corresponds to a portion without any pit PT i.e., threading dislocation TD is not formed. Further, the active layer 14 has the recess portion RC corresponding to the pit PT on the surface of the embedded portion 14B. The recess portion RC has a pyramidal shape, whose apex 14P is formed at a point corresponding to the apex VT (i.e., center of the pit PT) of the pit PT. In other words, the trace of the pit PT remains as the recess portion RC in the surface of the active layer 14. The embedded portion 14B is formed so as to surround the threading dislocation TD.

The light emitting element 10 has a p-type semiconductor layer 15 (the second semiconductor layer) which is subsequently formed on the active layer 14 and has an opposite conductivity type to the n-type semiconductor layer 12. The p-type semiconductor layer 15 is made from a Mg doped GaN layer, for example. In addition, the p-type semiconductor layer 15 may have an electron blocking layer (not shown) such as a p-type AlGaN layer in the interface with the active layer 14. Further, the light emitting element 10 has the n-electrode (not shown) and the p-electrode (not shown) which apply a voltage across the n-type semiconductor layer 12 and the p-type semiconductor layer 15. In addition, the entirety including the n-type semiconductor layer 12, the pit formation layer 13, the active layer 14 and the p-type semiconductor layer 15 is referred to as a semiconductor structure layer SOL.

Figure 2A:
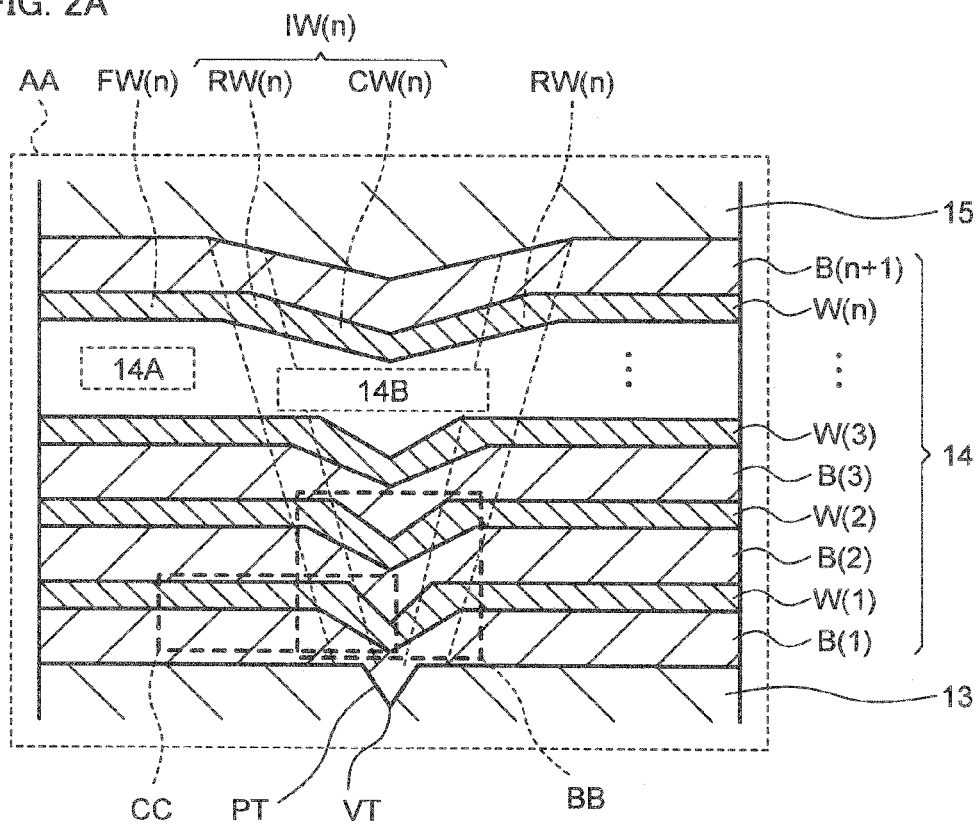
FIG. 2A is a cross-sectional view schematically partially illustrating a configuration, adjacent to a pit, of a semiconductor light emitting element of the first embodiment.

FIG. 2A shows a cross-sectional view schematically partially illustrating configuration of the active layer 14 of the light emitting element 10. FIG. 2A shows a partially enlarged cross-sectional view of a portion AA surrounded by a broken line shown in FIG. 1B. As shown in FIG. 2A, the active layer 14 has a multi-quantum well (MQW) structure having one or more well layers W(1)-W(n) and one or more barrier layers B(1)-B(n) laminated alternately in which each well layer and each barrier layer lie one upon another. The MQW will be described herein to have "n" number of well layers and "n" number of barrier layers. In the present embodiment, the "n" number of well layers W(1)-W(n) are InGaN layers and the "n" number of barrier layers B(1)-B(n) are GaN layers.

Specifically, the first barrier layer B(1) is layered on the pit formation layer 13, and the first well layer W(1) is layered on the first barrier layer B(1), and the second barrier layer B(2) is layered on the first well layer W(1) in sequence. Similarly, on the second barrier layer B(2), the well layers W(2)-W(n) and the barrier layers B(3)-B(n) are alternately layered. Further, the "(n+1)"th barrier layer B(n+1) is formed on the "n"th well layer W(n) proximate to the p-type semiconductor layer 15. The p-type semiconductor layer 15 is formed on the "(n+1)"th barrier layer B(n+1).

The flat portion 14A has the "n" number of flat well portions FW(1)-FW(n) which correspond to the "n" number of well layers W(1)-W(n) respectively. Thus, in FIG. 2A, only reference symbol FW(n) of the flat well portion corresponding to the well layer W(n) is shown as a representative.

The embedded portion 14B is one portion of lamination of the "n" number of well layers W(1)-W(n) and the "n" number of barrier layers B(1)-B(n) which corresponds to a portion formed to embed the pit PT. The embedded portion 14B has the "n" number of embedded well portions IW(1)-IW(n) which correspond to the "n" number of well layers W(1)-W(n) respectively. Thus, in FIG. 2A, only reference symbol IW(n) of the embedded well portion corresponding to the well layer W(n) is shown as a representative.

The "n" number of embedded well portions IW(1)-IW(n) have the "n" number of ring portions RW(1)-RW(n) respectively, in which each of the "n" number of ring portions RW(1)-RW(n) is formed in an interface with each of said at least one flat well portion so as to surround the threading dislocation TD. Each of the "n" number of ring portions RW(1)-RW(n) has a band gap smaller than that of each of the "n" number of flat well portions FW(1)-FW(n). Thus, in FIG. 2A, only reference symbol RW(n) of the ring portion is shown as a representative. In addition, here, the band gap refers to the energy difference between quantum energy levels of the well layers W(1)-W(n) in the active layer 14 with the multi-quantum well structure, for example.

In addition, each of the "n" number of embedded well portions IW(1)-IW(n) has the "n" number of central portions CW(1)-CW(n) inside of each of the ring portions RW(1)-RW(n). Thus, in FIG. 2A, only reference symbol CW(n) of the central portion is shown as a representative.

Figure 2B:
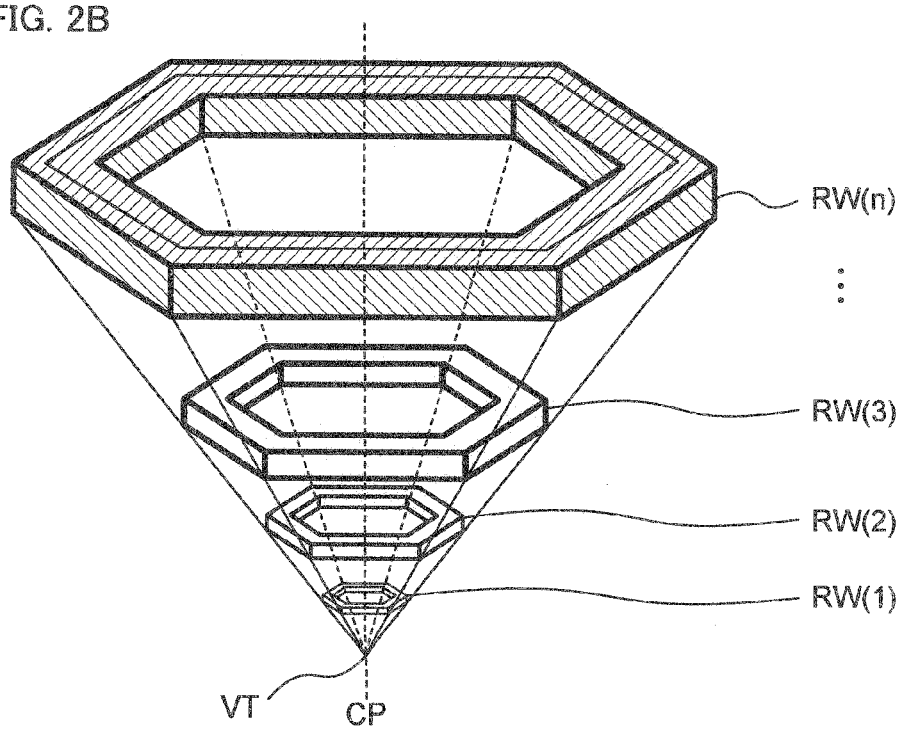
FIG. 2B is a perspective view schematically illustrating a configuration of ring portions of a semiconductor light emitting element of the first embodiment.

FIG. 2B shows a perspective view schematically illustrating a configuration of the ring portions RW(1)-RW(n). Further, in FIG. 2B, regions of the ring portion RW(n) are hatched, but portions other than the ring portion have no hatching. As shown in FIG. 2B, the ring portions RW(1)-RW(n) (n 2) are configured to be disposed at positions respectively in which distances of the positions from the center CP of the pit PT increase as the positions approach the p-type semiconductor layer 15. For example, the ring portion RW(2) nearer to the p-type semiconductor layer 15 than the ring portion RW(1) is formed at a position farther away from the center CP of the pit PT than the ring portion RW(1) (far outside of the center CP of the pit PT).

Further, each of the ring portions RW(1) and RW(2) has a hexagonal pyramid-shaped form and both are analogous to each other. Further, the ring portions RW(1) and RW(2) are successively formed to have the lengths of their circumferences (one rotation) expanding toward the p-type semiconductor layer 15.

As shown in FIG. 2B, it is preferable that the ring portions RW(1)-RW(n) (n≥2) are formed to be disposed at positions respectively in which distances of the positions from the center CP of the pit PT increase as the positions approach the p-type semiconductor layer 15. By this, the lowering of the luminous efficiency can be prevented.

Specifically, it has been seen that a high intensity light emission occurs from the well layer W(j) relatively near to the p-type semiconductor layer 15 in view of the effective mass between an electron and a hole. By keep the position of the ring portion RW(j) way from the center CP of the pit PT with respect to the well layer W(j) near to the p-type semiconductor layer 15, it is possible to remain carriers at a position relatively far from the threading dislocation TD. Therefore, access of carriers C into the threading dislocation TD can be effectively reduced.

Figure 3A:
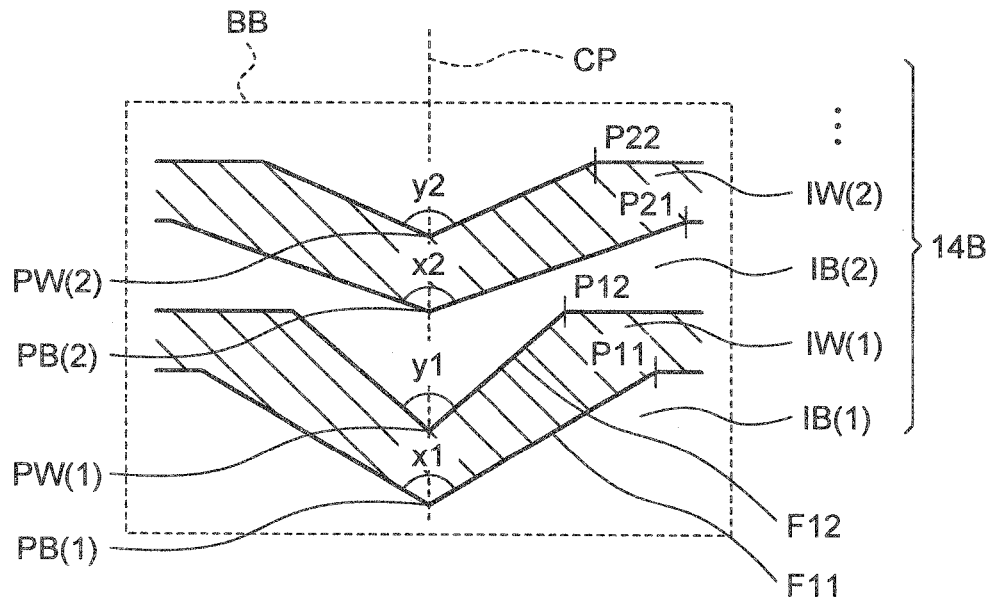
FIG. 3A is a cross-sectional view schematically partially illustrating a detail configuration of well layers and barrier layers in a semiconductor light emitting element of the first embodiment.

FIG. 3A shows a cross-sectional view schematically partially illustrating a detail configuration of the active layer 14 of the light emitting element 10. FIG. 3A shows a partially enlarged cross-sectional view of a portion BB surrounded by a broken line shown in FIG. 2B. The embedded portion 14B has the "n" number of embedded well portions IW(1)-IW(n) corresponding to the "n" number of well layers W(1)-W(n) respectively and the "n" number of embedded barrier portions IB(1)-IB(n) corresponding to the "n" number of barrier layers B(1)-B(n) respectively. In addition, FIG. 2B shows two of the embedded well portions IW(1) and IW(2) adjacent to the pit formation layer 13 and two of the embedded barrier portions IB(1) and IB(2) in the embedded portion 14B.

Further, the "n" number of embedded well portions IW(1)-IW(n) have apexes PW(1)-PW(n) on their respective interfaces nearer to the interface with the p-type semiconductor layer 15, in which the apexes PW(1)-PW(n) are positioned at the respective points each corresponding to the apex VT of the pit PT in the respective interfaces. Further, the "n" number of embedded barrier portions IB(1)-IB(n) have apexes PB(1)-PB(n) on their respective interfaces nearer to the interface with the p-type semiconductor layer 15, in which the apexes PB(1)-PB(n) are positioned at the respective points each corresponding to the apex VT of the pit PT in the respective interfaces. In addition, FIG. 2B shows two apexes PW(1) and PW(2) of the embedded well portions IW(1) and IW(2) and two apexes PB(1) and PB(2) of the embedded barrier portions IB(1) and IB(2) on the side of the pit formation layer 13.

In other words, each of the "n" number of embedded well portions IW(1)-IW(n) and the "n" number of embedded barrier portions IB(1)-IB(n) has inclined faces (facets) formed to extend from each of the apexes toward the p-type semiconductor layer 15. Thus the embedded portion 14B has a structure configured to have the inclined faces of the "n" number of embedded well portions IW(1)-IW(n) and the "n" number of embedded barrier portions IB(1)-IB(n) consecutively formed in the layered direction of the semiconductor structure layer SCL.

Each of the "n" number of embedded well portions IW(1)-IW(n) and the embedded barrier portions IB(1)-IB(n) is configured such that a facet upper end Pj2 of the embedded well portion IW(j) is formed at a position close to a center of the center CP of the pit PT than a facet upper end Pj1 (upper end of the facet Fj1) of the embedded barrier portion IB(j) (1≤j≤n) in the "n" number of embedded well portions IW(1)-IW(n) and the embedded barrier portions IB(1)-IB(n), wherein the embedded well portion IW(j) is subsequently formed on the adjacent embedded barrier portion IB(j) in the "n" number of embedded well portions IW(1)-IW(n) and the "n" number of embedded barrier portions IB(1)-IB(n).

For example, as shown in FIG. 3A, the upper end P12 of the facet F12 of the embedded well portion IW(1) is formed at a position far from a center of the center CP than the upper end P11 of the facet F11 of the embedded barrier portion IB(1), wherein the embedded well portion IW(1) is subsequently formed on the adjacent embedded barrier portion IB(1).

Further, the "n" number of embedded well portions IW(1)-IW(n) are configured such that its facet upper ends Pj2 are formed at positions respectively in which distances of the positions from the center CP of the pit PT increase as the positions approach the p-type semiconductor layer 15. Specifically, in the "n" number of embedded well portions IW(1)-IW(n), the facet upper end P(j+1)2 of the embedded well portion IW(j+1) on the embedded well portion IW(j) is formed at a position far away from the center CP of the pit PT than the facet upper end Pj2 of the embedded well portion IW(j).

For example, the facet upper end P22 of the embedded well portion IW(2) on the embedded well portion IW(1) is formed at a position far away from the center CP of the pit PT than the facet upper end P12 of the embedded well portion IW(1). Further, the facet upper ends of each layer have a positional relation as shown in FIG. 3A as a whole.

Therefore, as shown in FIG. 2A and FIG. 2B, amass portion of the well layer W(j) larger in thick than the flat portion 14A is formed in the interface between the flat portion 14A and the embedded portion 14B. The ring portion RW(j) provided with the embedded portion 14B corresponds to a connected portion consisting of relatively fat thickness portions in the embedded well portion IW(j). Namely, the thickness ratio of the ring portion RW(j) with respect to the thickness of the barrier layer B(j) is larger than the thickness ratio of the he flat well portion FW(j) with respect to the thickness of the flat portion 14A.

The "n" number of embedded well portions IW(1)-IW(n) and the "n" number of embedded barrier portions IB(1)-IB(n) can be formed in the following growth conditions. Firstly, the well layer W(j) is grown at a temperature higher than a growth temperature for a typical InGaN layer. Whereas the barrier layer B(j) is grown and formed up to a thickness thinner than a typical barrier layer at a temperature lower than a growth temperature for a typical GaN layer with a rate slower than a growth rate for a typical GaN layer.

When a GaN layer is grown as a barrier layer B(j) and a InGaN layer is grown as a well layer W(j) in consideration of the above conditions, the well layer W(j) has a promoted growth rate in the lateral direction of the InGaN layer (in-plane direction). Thus, the facet upper end Pj2 of the embedded well portion IW(j) (i.e., formation end boundary of the facet Fj2 in the interface nearer to the p-type semiconductor layer 15) is formed at a position nearer to the center of the pit PT than the facet upper end Pj1 of the embedded barrier portion IB(j) is. In other words, the facet of the well layer W(j) is formed from the inner position more inside than the facet upper end Pj1 of the embedded barrier portion IB(j). Further, when the well layer W(j) and the barrier layer B(j) are grown continuously under the foregoing conditions, the facet upper ends of the embedded well portion and the embedded barrier portion go gradually away from the pit PT respectively.

Each of the "n" number of embedded well portions IW(1)-IW(n) and the "n" number of embedded barrier portions IB(1)-IB(n) is configured such a manner that the apex angle yj (the second apex angle) of the apex PW(j) in the embedded well portion IW(j) is smaller than the apex angle xj (the first apex angle) of the apex PB(j) of the embedded barrier portion IB(j) (1≤j≤n:j and n denote integers) with respect to each pair the embedded well portion and the embedded barrier portion which are situated adjacent to each other in the "n" number of embedded well portions IW(1)-IW(n) and the "n" number of embedded barrier portions IB(1)-IB(n).

For example as shown in FIG. 3A, regarding the embedded well portion IW(2) and the embedded barrier portion IB(2) situated adjacent to each other, the apex angle y2 (the second apex angle) of the apex PW(2) in the embedded well portion IW(2) is smaller than the apex angle x2 (the first apex angle) of the apex PB(2) in the embedded barrier portion IB(2).

Further, when n≥2, i.e. the embedded portion 14A has plural embedded well portions, the "n" number of embedded well portions IW(1)-IW(n) are configured such that the nearer to the p-type semiconductor layer 15 the embedded well portions become, the greater the apex angles y1-yn of the apexes PW(1)-PW(n) become. Specifically, for example, as shown in FIG. 3A, the apex angle y2 of the apex PW(2) of the second embedded well portion IW(2) is larger than the apex angle y1 of the apex PW(1) of the first embedded well portion IW(1). Further, the apex 14P of the recess portion RC has an apex angle larger than the apex VT of the pit PT (see FIG. 1B).

In addition, when forming the active layer 14 under the foregoing conditions, the inventors have found that the surface flatness quality of the well layer W(j) of the InGaN layer is improved. Namely, when forming the active layer 14 to include the embedded portion 14B having the foregoing configurations, the active layer 14 with a high crystal quality is obtained. Therefore, the obtained semiconductor light emitting element has a uniform light emission distribution and has a high light emission efficiency.

In addition, it is preferable that the apex angle of the apex 14P of the recess portion RC, i.e., the apex angle of the apex of the embedded barrier portion corresponding to the barrier layer B(n+1) is an angle of 150 degree or less. When the apex angle of the apex of the recess portion RC exceeds the angle of 150 degree, the pit PT is filled with the embedded portion 14B almost after formation of the active layer 14. In case, the pit PT does not function, carriers reach the threading dislocation TD probably. Therefore, the light emission efficiency may decrease when driven by a large current.

In addition, for a modified embodiment from the first embodiment, the barrier layer B(j) may have a tow layer structure of the GaN layer and the InGaN layer. Namely, the barrier layer B(j) may include a further InGaN layer. When providing an InGaN layer as the barrier layer B(j), such an InGaN barrier layer is formed on the InGaN layer (InGaN well layer) as the well layer W(j), and the GaN layer is provided on the InGaN barrier layer, for example. Further, InGaN barrier layer has a band gap larger than that of the InGaN well layer. In addition, when the barrier layer B(j) has the InGaN barrier layer, the ring portion RW(j) can be formed in stableness.

Specifically, when the InGaN barrier layer is formed on InGaN well layer and then the GaN layer (GaN barrier layer) is formed on the InGaN barrier layer, significant increase of the apex angle of the embedded barrier portion IB(j) can be prevented. Therefore, it is prevented such that the apex angle of the embedded barrier portion becomes too large before forming a desired number of the well layers, that is, the surface of the embedded portion is flattened near to a perfect flat during the formation of the active layer. When the embedded portion is formed to be nearly flat surface, the shape of the ring portion RW(j), i.e., relationship of the thickness difference between the ring portion RW(j) and the central portion CW(j) becomes unstable. Therefore, when considering stableness of formation of the ring portion RW(j), it is preferable that the barrier layer includes the InGaN layer.

Figure 3B:
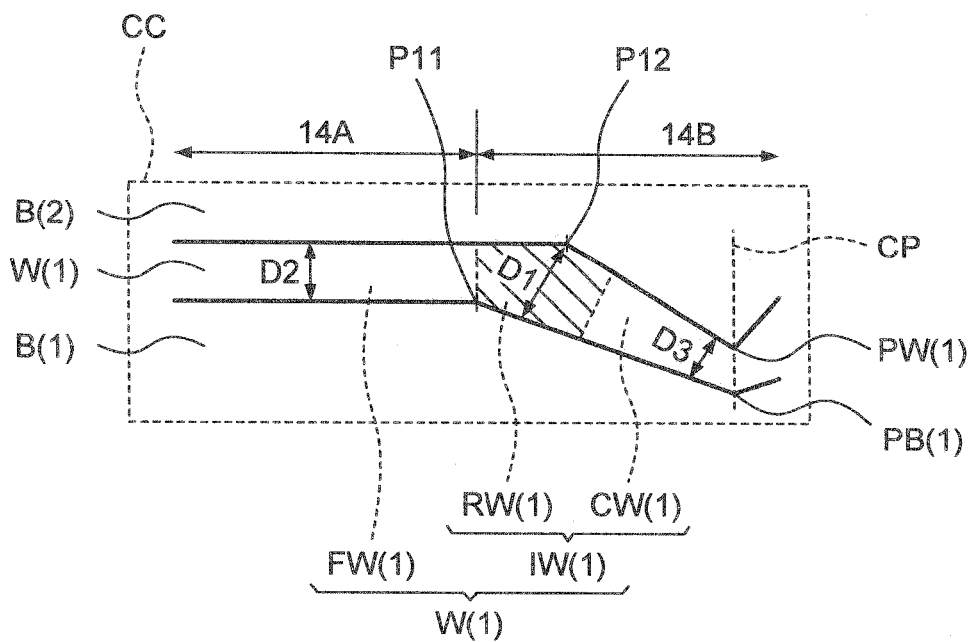
FIG. 3B is a cross-sectional view schematically partially illustrating a detail configuration of a well layer in a semiconductor light emitting element of the first embodiment.

FIG. 3B shows a cross-sectional view illustrating a detail configuration adjacent to the well layer W(j) of the pit PT. FIG. 3B shows a partially enlarged cross-sectional view of a portion CC surrounded by a broken line shown in FIG. 2A. In addition, each of the other well layers W(2)-W(n) has the same configuration as the well layer W(1) although FIG. 3B shows the well layer W(1) only. Thus, for easily understandings, the ring portion RW(1) portion is only hatched in FIG. 3B.

As shown in FIG. 3B, the well layer W(1) has the flat well portion FW(1) included in the flat portion 14A and the embedded well portion IW(1) included in the embedded portion 14B. Further, the embedded well portion IW(1) has the central portion CW(1) and the ring portion RW(1). The ring portion RW(1) has a thickness larger than that of the flat well portion FW(1).

Specifically, the facet upper end P12 of the embedded well portion IW(1) is formed at a position close to the center CP of the pit PT than the facet upper end P12 of the barrier layer B(1) formed thereunder. Further, the embedded barrier portion IB(1) and the embedded well portion IW(1) are formed to have facets extending towards the center CP of the pit PT. Therefore, as shown in FIG. 3B, a fat thickness portion (the ring portion RW(1)) is formed in the interface with the flat well portion FW(1) of the embedded well portion IW(1), in which the fat thickness portion being partially larger in thickness than the flat well portion FW(1).

Therefore, the thickness D1 of the fattest portion of the ring portion RW(1) is larger than the thickness D2 of the flat well portion FW(1). Further, the thickness of the thinnest portion of the ring portion RW(1) is the same as the thickness D2. Therefore, the ring portion RW(1) has a band gap (energy level) smaller than that of the flat well portion FW(1). In addition, the thickness D3 of the thinnest portion of the central portion CW(1) is smaller than the thickness D1 of the ring portion RW(1) and smaller than the thickness D2 of the flat well portion FW(1). Therefore, the central portion CW(1) has a band gap larger than those of the ring portion RW(1) and the flat well portion FW(1).

Further, in the entirety of the active layer 14, the well layer W(j) has the above-mentioned configuration of the flat well portion FW(j) and the embedded well portion IW(j). Therefore, when considering the entirety of the embedded portion 14B, the thickness ratio of the ring portion RW(j) with respect to the thickness of the entirety is larger than the thickness ratio of the ring portion RW(j) with respect to the thickness of the flat portion 14A.

In addition, the ring portion RW(j) can be formed simultaneously together with the other shapes above-mentioned by forming the active layer 14 under the foregoing growth conditions. Specifically, when adjusting the growth conditions while preferentially considering the surface flatness quality of the InGaN layer as the well layer, the positions of the facet upper ends of the embedded well portions IW(j) are disposed in order outside towards the p-type semiconductor layer 15. Therefore, it is possible to form readily the ring portions RW(j) which are displaced in order from the center CP of the pit PT outside towards the p-type semiconductor layer 15, without using a new step.

In addition, as shown in FIG. 3B, the ring portion RW(1) has substantially a pentagonal cross section shape. Namely, the ring portion RW(1) has the pentagonal cross section shape and is formed to extend in a ring-shape along the side faces of the pit PT. In addition, the whole shape of the ring portion RW(1) is schematically shown in FIG. 2B. Further, it is not necessary for the ring portion to have exactly the pentagonal cross section shape. For example, the facet upper end P2$j$ of the ring portion RW(j) may be formed into a curved shape according to the growth conditions instead of the pentagonal cross section shape of the apex. As mentioned above, the ring portion RW(j) is a portion having a band gap smaller than that of the flat well portion FW(j) e.g. a portion having a thickness larger than that of the flat well portion FW(j) in the well layer W(j).

Figure 4:
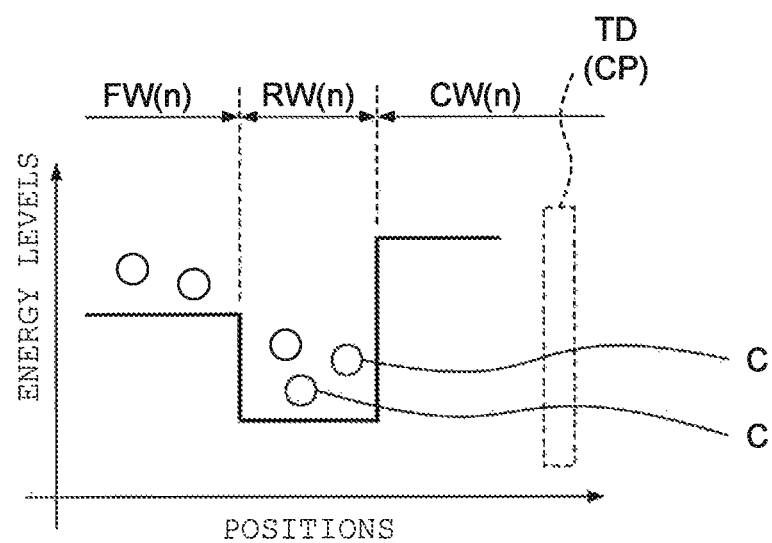
FIG. 4 is a schematic diagram partially illustrating an energy level in the well layer of a semiconductor structure layer of the semiconductor light emitting element of the first embodiment from the first embodiment.

FIG. 4 schematically shows a band gap of the flat well portion FW(n) the ring portion RW(n) and the central portion CW(n) in the active layer 14. In addition, In addition, here, the band gap refers to the energy difference between quantum energy levels of the well layer W(j) in the active layer 14 with the multi-quantum well structure. In FIG., the horizontal axis represents positions of respective portions, and the vertical axis represents energy levels of materials thereof. FIG. 4 shows carriers C for explanation.

As shown in FIG. 4, the ring portion RW(n) has a band gap smaller than that of the flat well portion FW(n). Further, the central portion CW(n) has a band gap larger than those of the flat well portion FW(n) and the ring portion RW(n). Therefore, the ring portion RW(n) can function as a store department storing carriers C. Specifically, there becomes highly probability for carriers C moving from the flat well portion FW(n) and reaching the ring portion RW(n) to remain in the ring portion RW(n). In other words, the carriers C reaching the ring portion RW(n) are prevented from passing through the central portion CW(n) and reaching the threading dislocation TD (the center CP of the pit PT). Therefore, it is prevented that the carriers C are consumed without emitting due to reaching at the threading dislocation TD.

In addition, an advantageous effect can be obtained by the light emitting element 10, when the light emitting element is driven by a large current or driven at a high temperature. Specifically, carriers C become hot carriers at a high temperature situation, and the hot carriers' kinetic energy is increased in comparison with at a normal temperature. Therefore, when the ring portion RW(n) is absent, hot carriers C overcome (overflow) the central portion CW(n) readily and reach at the center CP of the pit PT with a high probability. On the other hand, in the present embodiment, the ring portion RW(n) is provided between the flat well portion FW(n) and the central portion CW(n) wherein the ring portion RW(n) has a band gap smaller than those of the flat well portion FW(n) and the central portion CW(n).

Therefore, there is a high probability of a stay of the reaching carriers C in the ring portion RW(n). Further, the ring portion RW(n) has another function to increase indirectly a band gap difference between the flat well portion FW(n) and the central portion CW(n). Therefore, such a function prevents from hot carriers C overflowing into the central portion CW(n). Therefore, even when driven at the high temperature, it is possible for the present embodiment to exert the pit function, i.e., carrier barrier function as similar as driven at a normal temperature situation.

In the present embodiment, the active layer 14 has the embedded portion 14B on the pit PT, and the active layer 14 has the multi-quantum well structure. Further, the flat portion 14A and the embedded portion 14B have the flat well portion FW(j) and the embedded well portion IW(j) corresponding to the well layer W(j) respectively. Further, the embedded well portion IW(j) has the ring portion RW(j) which is formed in an interface with the flat well portion FW(j) so as to surround the threading dislocation TD wherein the ring portion RW(j) has a band gap smaller than that of the flat well portion FW(j). Therefore, carriers are stagnant in the ring portion RW(j) and prevented from reaching the threading dislocation TD in the active layer 14 having the multi-quantum well structure. Therefore, a light emitting element capable of restraining deterioration of luminous efficiency can be provided.

Further, each of the "n" number of embedded well portions IW(1)-IW(n) and the embedded barrier portions IB(1)-IB(n) is configured such that a facet upper end. Pj2 of the embedded well portion IW(j) is formed at a position close to a center of the center CP of the pit PT than a facet upper end Pj1 (upper end of the facet Fj1) of the embedded barrier portion IB(j) ($1 \leq j \leq n$) in the "n" number of embedded well portions IW(1)-IW(n) and the embedded barrier portions IB(1)-IB(n), wherein the embedded well portion IW(j) is subsequently formed on the adjacent embedded barrier portion IB(j) in the "n" number of embedded well portions IW(1)-IW(n) and the "n" number of embedded barrier portions IB(1)-IB(n). Therefore, by adjusting the growth conditions of the active layer 14, it is possible to form readily the ring portions RW(j).

In addition, it has been described that the embedded well portion IW(j) has the ring portion RW(j) which has a thickness larger than that of the flat well portion FW(j). Further, it has been described that a facet upper end Pj2 of the embedded well portion IW(j) is formed at a position close to a center of the center CP of the pit PT than a facet upper end Pj1 of the embedded barrier portion IB(j). However, the active layer 14 is not limited to these configurations. For example, as far as the ring portion RW(j) has partly a small portion with respect to the band gap, the embedded barrier portion IB(j) and the embedded well portion IW(j) have the same facet upper end common to each other.

Furthermore, in the present embodiment and the present modified embodiment, there is described that the first conductivity type is a p-type and the second conductivity type is an n-type opposite conductivity type to the p-type. Furthermore, the first conductivity type may be the n-type and the second conductivity type may be a p-type.

In the present embodiment, the embedded portion 14B has the embedded well portion IW(j) corresponding to the well layer W(j), in which the embedded well portion IW(j) has the ring portion RW(j) which is formed in an interface with the flat well portion FW(j) so as to surround the threading dislocation TD wherein the ring portion RW(j) has a band gap smaller than that of the flat well portion FW(j). Therefore, carriers are stagnant in the ring portion RW(j) and certainty prevented from reaching the threading dislocation TD. Consequently, it is possible to provide a light emitting element capable of strongly restraining deterioration of luminous efficiency even at a high temperature operation.

It is understood that the foregoing description and accompanying drawings set forth the preferred embodiments of the present invention at the present time. Various modifications, additions and alternative designs will, of course, become apparent to those skilled in the art in light of the foregoing teachings without departing from the spirit and scope of the disclosed invention. Thus, it should be appreciated that the present invention is not limited to the disclosed embodiments but may be practiced within the full scope of the appended claims.

This application is based upon and claims the benefit of priority from the prior Japanese Patent Application No. 2014-191268 filed on Sep. 19, 2014, the entire contents of which are incorporated herein by reference.

What is claimed is:

1. A semiconductor light emitting element comprising:
    a first semiconductor layer of a first conductivity type;
    a pit formation layer formed on said first semiconductor layer and having a pyramidal pit caused by a threading dislocation generated in said first semiconductor layer;
    an active layer formed on said pit formation layer and having a flat portion and an embedded portion which is formed so as to be embedded in said pit; and
    a second semiconductor formed on said active layer and having a second conductivity type which is opposite to the first conductivity type,
    wherein:
    said active layer has a multi-quantum well structure having at least one well layer and at least one barrier layer laminated alternately in which each well layer and each barrier layer lie one upon another,
    said flat portion has at least one flat well portion corresponding to said at least one well layer,
    said embedded portion has at least one embedded well portion corresponding to said at least one well layer,
    each of said at least one embedded well portion has at least one ring portion which is formed in an interface with each of said at least one flat well portion so as to surround said threading dislocation,
    each of said at least one ring portion has a band gap smaller than that of each of said at least one flat well portion.

2. The semiconductor light emitting element according to claim 1, wherein each of said at least one ring portion has a thickness larger than that of said at least one flat well portion corresponding to each of said at least one ring portion.

3. The semiconductor light emitting element according to claim 2, wherein:
    said embedded portion has at least one embedded barrier portion corresponding to said at least one barrier layer,
    each of said at least one embedded well portion and said embedded barrier portion is configured such that a facet upper end of the embedded well portion is formed at a position closer to a center of said it than a facet upper end of the embedded barrier portion.

4. The semiconductor light emitting element according to claim 3, wherein the facet upper end of the embedded well portion is formed at the position closer to the center of said pit than the facet upper end of the embedded barrier portion positioned nearer to the first semiconductor layer.

5. The semiconductor light emitting element according to claim 2, wherein:
    said embedded portion has a plurality of ring portions,
    said plurality of ring portions are disposed at positions respectively in which distances of the positions from said pit increase as the positions approach said second semiconductor layer.

6. The semiconductor light emitting element according to claim 1, wherein each of said first semiconductor layer, said pit formation layer, said active layer and said second semiconductor layer is made of a nitride-based semiconductor material.

* * * * *